United States Patent
Funayama et al.

(10) Patent No.: US 11,005,010 B2
(45) Date of Patent: May 11, 2021

(54) PHOSPHOR AND METHOD OF MANUFACTURING SAME, AND LED LAMP

(71) Applicants: KABUSHIKI KAISHA TOSHIBA, Tokyo (JP); TOSHIBA MATERIALS CO., LTD., Yokohama (JP)

(72) Inventors: Yoshitaka Funayama, Yokohama (JP); Yumi Kanno, Yokohama (JP); Hirofumi Takemura, Kamakura (JP); Tsutomu Ishii, Ashiya (JP); Yasuhiro Shirakawa, Yokohama (JP)

(73) Assignees: Kabushiki Kaisha Toshiba, Tokyo (JP); Toshiba Materials Co., Ltd., Yokohama (JP)

( * ) Notice: Subject to any disclaimer, the term of this patent is extended or adjusted under 35 U.S.C. 154(b) by 557 days.

(21) Appl. No.: 15/833,176

(22) Filed: Dec. 6, 2017

(65) Prior Publication Data

US 2018/0138374 A1 May 17, 2018

Related U.S. Application Data

(63) Continuation of application No. PCT/JP2016/002756, filed on Jun. 7, 2016.

(30) Foreign Application Priority Data

Jun. 12, 2015 (JP) .............................. JP2015-119676
Feb. 23, 2016 (JP) .............................. JP2016-031835

(51) Int. Cl.
- *H01L 33/50* (2010.01)
- *C09K 11/77* (2006.01)
- *C09K 11/08* (2006.01)

(52) U.S. Cl.
CPC .......... *H01L 33/502* (2013.01); *C09K 11/08* (2013.01); *C09K 11/7774* (2013.01); *H01L 2224/4848* (2013.01); *H01L 2224/48091* (2013.01); *H01L 2224/48465* (2013.01); *H01L 2224/8592* (2013.01); *H01L 2924/181* (2013.01)

(58) Field of Classification Search
CPC ..................... C09K 11/7774; H01L 33/502
See application file for complete search history.

(56) References Cited

U.S. PATENT DOCUMENTS

| | | | | |
|---|---|---|---|---|
| 6,017,670 A * | 1/2000 | Hashizume | ......... | G03G 9/0819 430/108.11 |
| 7,497,973 B2 * | 3/2009 | Radkov | ......... | C09K 11/778 252/301.4 H |
| 7,679,480 B2 * | 3/2010 | Stenerson | ......... | H01F 13/003 335/284 |
| 7,737,623 B2 * | 6/2010 | Kaneda | ......... | H01L 33/504 313/503 |
| 8,274,215 B2 * | 9/2012 | Liu | ......... | H05B 33/12 313/504 |
| 8,350,465 B2 * | 1/2013 | Winkler | ......... | C09K 11/7774 313/504 |
| 8,563,650 B2 * | 10/2013 | Yahiro | ......... | C08G 18/4252 524/801 |
| 8,796,915 B2 * | 8/2014 | Ooya | ......... | F21K 9/232 313/503 |
| 2004/0000868 A1 | 1/2004 | Shimizu et al. | | |
| 2004/0062699 A1 | 4/2004 | Oshio | | |
| 2004/0104391 A1 | 6/2004 | Maeda et al. | | |
| 2006/0124951 A1 | 6/2006 | Sakata et al. | | |
| 2006/0126355 A1 | 6/2006 | Yasuda et al. | | |
| 2007/0272899 A1 * | 11/2007 | Naum | ......... | H05B 33/14 252/301.4 R |
| 2009/0008663 A1 * | 1/2009 | Shimizu | ......... | C09K 11/7774 257/98 |
| 2011/0286132 A1 | 11/2011 | Ishii | | |
| 2013/0113008 A1 | 5/2013 | Shiobara et al. | | |
| 2013/0161849 A1 * | 6/2013 | Wataya | ......... | C09K 11/645 264/21 |
| 2015/0166888 A1 * | 6/2015 | Katsumoto | ......... | C09K 11/7792 252/301.4 R |

FOREIGN PATENT DOCUMENTS

| | | |
|---|---|---|
| JP | H10-036835 A1 | 2/1998 |
| JP | 2002-042525 A1 | 2/2002 |
| JP | 2002-151747 A1 | 5/2002 |
| JP | 2002-198573 A1 | 7/2002 |
| JP | 2003-179259 A1 | 6/2003 |
| JP | 2004-115304 A1 | 4/2004 |
| JP | 2005-008844 AI | 1/2005 |
| JP | 2005-150691 A1 | 6/2005 |
| JP | 2005-235847 A1 | 9/2005 |
| JP | 2005-243699 A1 | 9/2005 |
| JP | 2005-264062 A1 | 9/2005 |
| JP | 2005-317985 A1 | 11/2005 |
| JP | 2006-041096 A1 | 2/2006 |
| JP | 2006-167946 A1 | 6/2006 |
| JP | 2006-213893 A1 | 8/2006 |
| JP | 2006-253336 A1 | 9/2006 |
| JP | 2006-265542 A1 | 10/2006 |
| JP | 2006-299168 A1 | 11/2006 |
| JP | 2006-321974 A1 | 11/2006 |
| JP | 2006-324407 A1 | 11/2006 |
| JP | 2011-243267 A1 | 12/2011 |
| JP | 2013-147643 A1 | 8/2013 |
| JP | 2015-044938 A1 | 3/2015 |
| TW | 201335331 A1 | 9/2013 |
| WO | 2004/065324 A1 | 8/2004 |

OTHER PUBLICATIONS

International Search Report and Written Opinion (Application No. PCT/JP2016/002756) dated Aug. 30, 2016.

* cited by examiner

*Primary Examiner* — C Melissa Koslow
(74) *Attorney, Agent, or Firm* — Burr & Brown, PLLC

(57) ABSTRACT

A phosphor has a composition represented by Chemical formula 1: $1.5Y_2O_3 \cdot 2.5aAl_2O_3$:Ce where a is a number satisfying $1.02<a<1.1$.

8 Claims, 2 Drawing Sheets

PHOSPHOR AND METHOD OF MANUFACTURING SAME, AND LED LAMP

CROSS-REFERENCE TO RELATED APPLICATIONS

This application is a continuation of prior International Application No. PCT/JP2016/002756, filed on Jun. 7, 2016 which is based upon and claims the benefit of priority from Japanese Patent Applications No. 2015-119676 filed on Jun. 12, 2015 and No. 2016-031835 filed on Feb. 23, 2016; the entire contents of all of which are incorporated herein by reference.

FIELD OF THE INVENTION

Embodiments described herein generally relate to a phosphor and an LED lamp.

BACKGROUND OF THE INVENTION

A light-emitting diode (LED, it is also called an LED chip) is a light-emitting element acting as a light source by applying a voltage. The light-emitting diode emits light due to, for example, recombination between electron and hole in a vicinity of a contact surface (pn junction) of two semiconductors. Since the light-emitting diode is small and has high conversion efficiency from electric energy to light, it is widely used for home electric appliances, illuminated switches, LED displays, general lighting, or the like.

The light-emitting diode is different from an electric bulb using a filament. Accordingly, what is called "burn-out" does not occur in the light-emitting diode. The light-emitting diode is excellent in initial driving properties, and has excellent durability against vibration and repeated ON/OFF operation. Accordingly, the light-emitting diode is used also as a backlight of a display device provided in a vehicle dashboard or the like. Since the light-emitting diode is able to emit light with high saturation and vivid color without being affected by sunlight, it can also be used for a display device, a traffic display device, a traffic light, and so on provided at the outside.

The light-emitting diode is a semiconductor diode which radiates light, and converts electric energy into ultraviolet light or visible light. The light-emitting diode is also used for an LED lamp where a light-emitting chip formed by light-emitting materials such as GaP, GaAsP, GaAlAs, GaN, InGaAlP is sealed with a transparent resin to make use of visible light. The light-emitting diode is also used for a display-type LED lamp where the light-emitting materials are fixed on an upper surface of a print substrate or a metal lead, and sealed with a resin case having, for example, a shape of a numeric character or a shape of a character.

Various phosphor powders are added to a surface of the light-emitting chip or in the resin, and thereby, a color of radiated light can be adjusted. The LED lamp is therefore able to reproduce colors of light in a visible light region from blue to red according to purposes. In addition, the light-emitting diode is a semiconductor element, and it has long service life, high reliability, and an exchange frequency caused by a trouble is reduced when it is used as a light source. It is therefore widely used as a component of various display devices such as mobile communication equipment, personal computer peripheral equipment, OA equipment, household electric equipment, audio equipment, various switches, and a backlight light source display plate.

As a trend promoting popularization of LED, use of mercury for electric products or the like is prohibited in RoHS restriction (instructions regarding use restriction of specific toxic substances contained in electrical/electronic equipment) implemented in EU (European Union) in July 2006. Also in Japan, it is supposed that a conventional fluorescent light enclosing mercury vapor is replaced by a white light-emitting LED lamp not using mercury in light fixtures so as to conclude the "Minamata Convention" according to revisions to government and ministerial ordinances or the like in near future.

Improvement in emission efficiency has been sought so as to further promote popularization of LED. In recent years, a white LED package market is flat in terms of money amounts, and is not necessarily extended in spite of initial expectations. The emission efficiency of the white LED lamp is not necessarily superior to a conventional fluorescent light. In addition, though the white LED lamp has long service life, it is not enough to raise consumer awareness to immediately replace the current general lighting in consideration of a price of the product and energy-saving performance. Accordingly, the improvement in the emission efficiency is necessary to increase demand for the white LED lamp as an alternative of the fluorescent light in the future.

As the white light-emitting LED lamp (light-emitting device), there can be cited, for example, a light-emitting device in a type where a blue light-emitting diode and green and yellow light-emitting phosphors, in some cases, further a red phosphor are combined (it is called Type 1), a light-emitting device in a type where an ultraviolet or violet light-emitting diode and blue, yellow and red phosphors are combined (it is called Type 2). At present, Type 1 is the most widely used because superiority thereof in which Type 1 has higher luminance than Type 2 is appreciated.

As the green and yellow phosphors used for the purpose of the light-emitting device in Type 1, there are practically used phosphor materials such as a cerium-activated yttrium aluminate phosphor (YAG), a cerium-activated terbium aluminate phosphor (TAG), and an alkaline earth silicate phosphor (BOSS).

Among the phosphor materials, YAG and BOSS have been generally known phosphors before they are used in combination with the light-emitting diode. They have been examined and used in a flying spot scanner, a fluorescent light, and so on, or attempted to apply to applied products. These phosphors are already practically used as a backlight phosphor of cellular phones, but it has been improved day by day aiming for further expansion of demand for lighting devices, vehicle headlamp, and so on.

There are described in various documents regarding results of improvement aiming for the practical use. Concretely, there has been continued attempts such that a part of basic components of a phosphor is replaced by other kind of elements, a replace amount is optimized, and a kind and an addition amount of activator are adjusted.

Improvement in the emission efficiency is necessary in the conventional white LED lamp in Type 1 which is formed by combining the blue light-emitting diode and BOSS or the yellow light-emitting phosphor such as YAG, TAG, and has superior luminance properties.

DETAILED DESCRIPTION OF THE INVENTION

Figure 1:
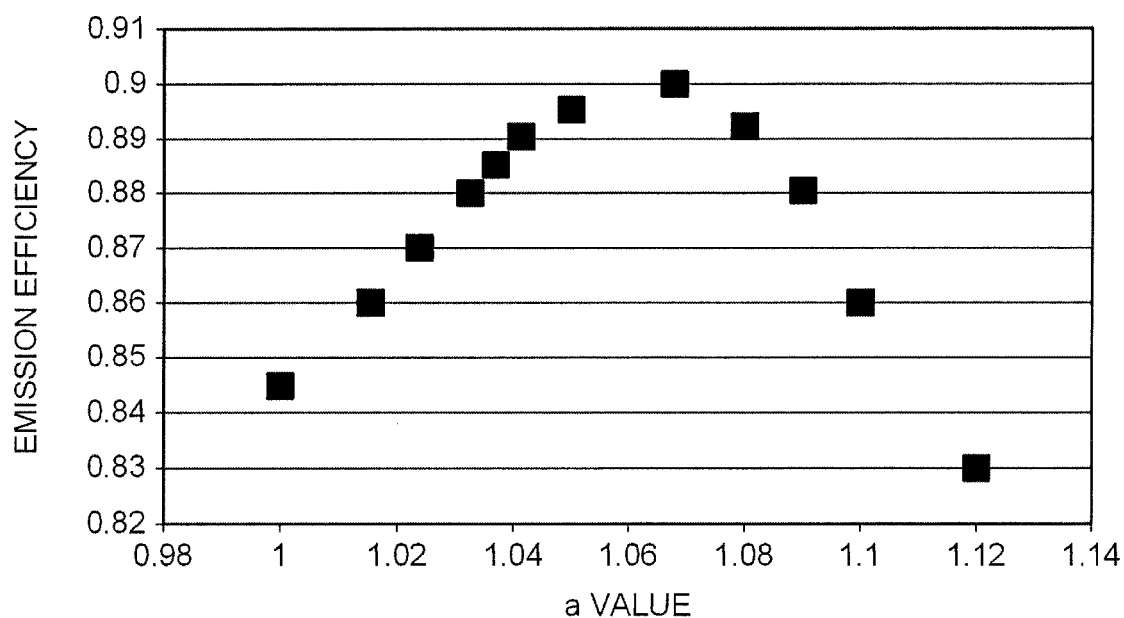
FIG. 1 is a view illustrating a relationship between a value of "a" and emission efficiency in a phosphor of the present embodiment.

A phosphor of the present embodiment comprises a phosphor powder. The phosphor powder has a composition represented by Chemical formula 1: $1.5Y_2O_3 \cdot 2.5aAl_2O_3$:Ce where a is a number satisfying $1.02<a<1.1$.

[Phosphor]

A phosphor of the present embodiment has a composition represented by Chemical formula 1: $1.5Y_2O_3 \cdot 2.5aAl_2O_3$:Ce (in the formula, "a" is a number satisfying $1.02<a<1.1$). The phosphor of this embodiment is formed by mixing and reacting 1.5 mol of yttrium oxide ($Y_2O_3$) and 2.5×a (where "a" is a number satisfying $1.02<a<1.1$) mol of aluminum oxide ($Al_2O_3$), and further activating Ce.

In the phosphor of this embodiment, a part of Y may be replaced by at least one element of Lu, Gd, and Tb. In the phosphor of this embodiment, a part of Al may be replaced by at least one of a first element being Ga, second elements being Mg and Si, and third elements being Sc and B.

The element which replaces a part of Y and the element which replaces a part of Al are elements which undertake a role of shifting an emission wavelength of the phosphor. Lu, Ga, and a pair of elements of Sc and B are able to shift the emission wavelength to a short wavelength side. Gd, Tb, and a pair of elements of Mg and Si are able to shift the emission wavelength to a long wavelength side.

A replacement ratio of Sc is preferably the same ratio in atom % as a replacement ratio of B. A replacement ratio of Mg is preferably the same ratio in atom % as a replacement ratio of Si. The replacement can be also regarded that two Al atoms are replaced by a pair of atoms. At this time, the pair of elements is selected such that an average valence and an average ionic radius of these elements are approximately the same as a valence (+3) and an ionic radius (0.53 angstrom) of Al. A wavelength shift occurred by replacing to the pair of elements is also attained by, for example, replacing a part of Y to (Ca, Zr) or (Sr, Zr).

That is, the composition of the phosphor of this embodiment can be represented by $1.5((Y,Lu)_{1-x}M1_x)_2O_3 \cdot 2.5a(Al_{1-y-z}Ga_y(M2,M3)_z)_2O_3$:Ce    Chemical formula 2:

(in the formula, M1 is at least one element of Gd and Tb, (M2, M3) is (Mg, Si) or (Sc, B), "x" is a number satisfying $0 \leq x < 0.6$, "a" is a number satisfying $1.02 < a < 1.1$, "y" is a number satisfying $0 \leq y < 0.4$, and "z" is a number satisfying $0 \leq z < 0.1$). When "z" is a number larger than "0" (zero), a ratio of the element M3 in atom % with respect to the element M2 in atom % is 0.9 or more and 1.1 or less.

Among the elements replacing Y, Lu is able to replace a part or all of Y. M1 is at least one element of Gd or Tb, and the replacement in a range not exceeding 60% of Y is preferable. When the ratio exceeds 60%, it is not preferable because luminance remarkably deteriorates. Among the elements replacing Al, the replacement in a range not exceeding 40% of Al by Ga is preferable, and the luminance remarkably deteriorates when the ratio exceeds 40%. A replacement amount of the pair of elements such as (Mg, Si) or (Sc, B) is preferably in a range not exceeding 10%. The pair of elements is able to shift the wavelength to a desired emission wavelength even by a slight replacement amount. When the replacement amount exceeds 10%, there is a possibility that the luminance deteriorates.

FIG. 1 is a view illustrating a relationship between a value of "a" and emission efficiency in the phosphor of this embodiment. In FIG. 1, a horizontal axis plots the value of "a", and a vertical axis plots the emission efficiency of the phosphor. The value of "a" is calculated from analysis values of Y and Al of the obtained phosphor.

In FIG. 1, when "a" is 1, the composition is "$1.5Y_2O_3 \cdot 2.5Al_2O_3$:Ce". The notation of "$1.5Y_2O_3 \cdot 2.5Al_2O_3$:Ce" can be converted into "$Y_3Al_5O_{12}$:Ce". "$Y_3Al_5O_{12}$:Ce" is a cerium-activated yttrium aluminum garnet (YAG) phosphor.

In FIG. 1, the emission efficiency becomes high in accordance with increase of the value of "a", and forms a peak in a vicinity of "a=1.07". When the value of "a" exceeds 1.1, the emission efficiency decreases rapidly. Accordingly, the emission efficiency higher than that of the conventional YAG can be obtained by setting the value of "a" to fall within a range of 1.02 to 1.10. The value of "a" is more preferably in a range of 1.03 to 1.09, and further preferably in a range of 1.04 to 1.08. Among rear-earth elements contained in the phosphor, a ratio of Ce is 2 to 20 atom %, and preferably 3 to 15 atom %.

The emission efficiency in FIG. 1 can be obtained by measuring the emission efficiency by using an evaluation system for phosphor emission efficiency (C9920) manufactured by Hamamatsu Photonics Corporation. The emission efficiency is measured by filling a phosphor into a dedicated cell, and setting a monochrome light source. Light from an excitation light source and light from the phosphor are excited on the same side (reflection) with respect to the phosphor. The emission efficiency is a value obtained by multiplying a ratio of light source excitation light which is absorbed by the phosphor (absorptance) and a ratio where the absorbed excitation light is changed into light-emission of the phosphor (internal quantum efficiency), and it is a quantity called also an external quantum efficiency.

Table 1 is a comparison result between phosphors of the present embodiments (Embodiments 1A to 3A) and conventional phosphors (Conventional examples 1A to 3A) having approximately the same emission wavelengths as the phosphors.

TABLE 1

|  | Phosphor Composition | a Value | Emission Peak Wavelength (nm) | Emission Efficiency |
|---|---|---|---|---|
| Embodiment 1A | $1.5Y_2O_3 \cdot 2.625Al_2O_3$:Ce | 1.05 | 552 | 0.90 |
| Conventional Example 1A | $1.5(Y_{0.8}Gd_{0.2})_2O_3 \cdot 2.5Al_2O_3$:Ce | 1 | 552 | 0.86 |
| Embodiment 2A | $1.5Y_2O_3 \cdot 2.56Al_2O_3$:Ce | 1.024 | 549 | 0.87 |

TABLE 1-continued

|  | Phosphor Composition | a Value | Emission Peak Wavelength (nm) | Emission Efficiency |
|---|---|---|---|---|
| Conventional Example 2A | $1.5(Y_{0.9}Gd_{0.1})_2O_3 \cdot 2.5Al_2O_3$:Ce | 1 | 549 | 0.85 |
| Embodiment 3A | $1.5Y_2O_3 \cdot 2.65Al_2O_3$:Ce | 1.06 | 560 | 0.90 |
| Conventional Example 3A | $1.5(Y_{0.5}Gd_{0.5})_2O_3 \cdot 2.5Al_2O_3$:Ce | 1 | 560 | 0.85 |

As it is clear from Table 1, each phosphor of this embodiment exhibits higher emission efficiency than the conventional phosphor at the same emission wavelength. Even when a part of Y or Al of each of the phosphors of Embodiments 1A to 3A is replaced by other elements, the phosphor exhibits the higher emission efficiency than the phosphors of Conventional examples 1A to 3A. However, when the "a" value is approximated to 1, the emission efficiency decreases to a value lower than the conventional value. It can be seen from the above that the emission efficiency can be improved by increasing a ratio of $Al_2O_3$ of the phosphor even when a part of Y or Al is replaced by other elements.

The phosphor is in a powder form. An average particle diameter of particles forming the phosphor is, for example, 3 μm or more and 80 μm or less, preferably 5 μm or more and 40 μm or less, and more preferably 5 μm or more and 30 μM or less. Here, the average particle diameter is a value measured using a laser diffraction particle size distribution measurement device, and means a median value D50 in a volume cumulative distribution. The phosphor whose particles are adjusted to fall within a preferable particle diameter range is used, and thereby, it is possible to obtain a white LED lamp with high luminance and small color unevenness, and to reduce variation in luminance and color by each LED.

A shape of the particle forming the phosphor is preferable as it more approximates a sphere. The emission luminance of the light-emitting device can be further improved by approximating the particle shape to the sphere. In the light-emitting device including the semiconductor light-emitting element and the phosphor, light radiated from the semiconductor light-emitting element is reflected at a surface of the phosphor, or light radiated from the phosphor is reflected at a surface of other phosphors to thereby repeat multiple reflection, and the light is taken out to the outside. A reflection phenomenon of light lowers energy efficiency of light. Accordingly, a surface area of the particle of the phosphor is preferably reduced by making the particle shape into the spherical shape so as to suppress the lowering of the energy efficiency of light.

Whether the particle shape of the phosphor is the spherical shape is determined while using a sphericity (ψ) of Wadell (hereinafter, it is also called "sphericity") as an index. The sphericity of the particle forming the phosphor is preferably, for example, 0.80 or more. For example, the sphericity can be increased by manufacturing the phosphor by using a later-described method for manufacturing the phosphor of this embodiment.

The sphericity (ψ) of Wadell is defined by the following expression (A1) as a ratio between a surface area of an actual particle and a surface area of a sphere which has the same volume as the particle.

ψ=(the surface area of the sphere having the same volume as the particle)/(the surface area of the actual particle)     (A1)

Ordinarily, a particle having the smallest surface area is a spherical particle among the particles each having an arbitrary volume. Accordingly, the sphericity (ψ) of Wadell is 1 or less in a normal particle, and when the particle shape is not sphere, the sphericity approximates 1 as the shape is close to the sphere.

The sphericity (ψ) of Wadell can be found by the following method. First, a particle size distribution of the powder phosphor is measured by a Coulter-counter method. The Coulter-counter method is a method specifying a particle size from a voltage change in accordance with a volume of a particle. In the particle size distribution obtained by the Coulter-counter method, a number frequency in a certain particle diameter Di is set to Ni. The particle diameter Di is a diameter of the spherical particle having the same volume as the actual particle whose particle size is specified by the Coulter-counter method.

A specific surface area (S) of the powder phosphor is calculated by using the number frequency Ni and the particle diameter Di. The specific surface area is a value where the surface area of powder is divided by a weight thereof, and it is defined as a surface area per a unit weight. The weight of the particle having the particle diameter Di is $(4\pi/3) \times (Di/2)^3 \times Ni \times p$ (where p is a density of the powder). The weight of the powder is a sum of weights of particles by each particle diameter, and it is represented by the following expression (A2).

Weight of powder=$\Sigma\{(4\pi/3) \times (Di/2)^3 \times Ni \times \rho\}$     (A2)

The surface area of the particle having the particle diameter Di is defined by $4\pi \times (Di/2)^2 \times Ni$. When the actual particle shape is not sphere, a specific surface area of the actual particle is a value ($\{4\pi \times (Di/2)^2 \times Ni\}/\psi$) where the surface area of the particle is divided by the Wadell sphericity (ψ), and the specific surface area (S) of the powder is a sum of the specific surface areas of the particles by each particle diameter, and it is represented by the following expression (A3). Actually, the Wadell sphericity (ψ) may be different by each particle diameter, but it can be taken as an average value being a deviation from the sphere as a whole of the powder.

$$S=[\Sigma\{4\pi \times (Di/2)^2 \times Ni\}\psi]/[\Sigma\{(4\pi/3) \times (Di/2)^3 \times Ni \times \rho\}]= (6/\rho/\psi) \times \{\Sigma(Di^2 \times Ni)\}/\{\Sigma(Di^3 \times Ni)\}$$     (A3)

As methods for measuring the particle diameter of the powder, air permeability methods (a Blaine method, a Fisher method, and the like) are known. In the air permeability method, powder is filled in a metal tube whose both ends are opened, then air is passed through the powder layer to define the particle diameter from a passage ratio of the air. The particle diameter defined by the air permeability method is also called a specific surface area diameter (d). The specific surface area diameter (d) and the specific surface area (S) have a relationship represented by the following expression (A4).

S=6/ρ/d     (A4)

Accordingly, the sphericity (ψ) of Wadell is represented by the following expression (A5), and can be calculated by comparing the specific surface area calculated from the particle size distribution and the specific surface area calculated from the particle diameter obtained by the air permeability method. Though the particle diameter of the particle size distribution is normally represented as a particle diameter range, the particle diameter Di is set as an intermediate value of the particle diameter range, and the particle diameter range is set every 0.2 μm so as to increase accuracy in this embodiment. When the particle size distribution is plotted on logarithmic normal probability paper, it can be approximated by two lines. Accordingly, it is possible to easily obtain a number frequency data of every 0.2 μm from normal probability distributions of these two lines.

$$\psi = d \times \{\Sigma(Di^2 \times Ni)\} / \{\Sigma(Di^3 \times Ni)\} \quad (A5)$$

As described above, the phosphor of this embodiment is a phosphor which is formed as follows: the present inventors fabricate phosphors having various compositions, a part of major components of the conventional phosphor is replaced by other elements, effects exerted on emission characteristics of the phosphors by a kind of the replaced element and a replacement amount are compared and examined by a series of experiments. Particularly, in an aluminate phosphor having a garnet structure, the emission efficiency can be more improved by shifting a ratio between rear-earth oxide and aluminum oxide being components of the aluminate phosphor to a composition where the aluminum oxide goes to excess. Further, the phosphor having excessive aluminum oxide is used as a base, and it is combined with impurities each having a function to shift the emission wavelength to a long wavelength side or a short wavelength side, and thereby, the phosphor having various emission colors and high emission efficiency which are practically required can be obtained.

[Method for Manufacturing Phosphor]

The phosphor of this embodiment is produced by, for example, mixing respective phosphor materials, and firing the obtained phosphor material mixture in a reduced oxygen atmosphere. Concrete manufacturing method examples are described below.

First, phosphor materials containing elements forming the composition of the phosphor of this embodiment, for example, rear-earth oxides ($Y_2O_3$, $Lu_2O_3$, $Gd_2O_3$, $Tb_4O_7$), aluminum oxide ($Al_2O_3$), magnesium oxide (MgO), silicon oxide ($SiO_2$), scandium oxide ($Sc_2O_3$), boron oxide ($B_2O_3$), gallium oxide ($Ga_2O_3$), cerium oxide ($CeO_2$), and so on are dry-mixed to fabricate the phosphor material mixture.

It is preferable to add 0.05 to 3 mass % of barium fluoride ($BaF_2$) and 0.01 to 1 mass % of yttrium chloride ($YCl_3$) to the phosphor material mixture when the phosphor material mixture containing flux is set as 100 mass %. When the phosphor material mixture contains these fluxes, the sphericity of an obtained phosphor powder can be increased. When compounding amounts of these fluxes both exceed upper limit values, luminance of the phosphor is likely to be lowered by abnormal growth of phosphor particles. When the compounding amounts are both lower limit values or less, the sphericity cannot be sufficiently increased. The phosphor material mixture may contain fluoride of an alkali metal or an alkaline-earth metal such as potassium fluoride being a reaction accelerator as another flux.

Next, the phosphor material mixture is filled into a refractory crucible. As the refractory crucible, there are used, for example, an aluminum crucible, a carbon crucible, and so on. The phosphor material mixture filled in the refractory crucible is fired. An apparatus where a composition of a firing atmosphere in the apparatus where the refractory crucible is disposed, a firing temperature and a firing time are kept to predetermined conditions is used as a firing apparatus. For example, an electric furnace is used as such a firing apparatus.

As the firing atmosphere, reducing gas is used. As the reducing gas, there are used, for example, $N_2$ gas, Ar gas, mixed gas of $N_2$ and $H_2$, and so on. When the reducing gas is the mixed gas of $N_2$ and $H_2$, a mole ratio of $N_2$ and $H_2$ ($N_2:H_2$) in inert gas is 10:0 to 1:9, preferably 9:1 to 3:7. It is preferable to circulate the reducing gas in a chamber of the firing apparatus to form a gas flow because uniform firing is enabled. It is also effective to dispose carbon (C) inside and outside the crucible so as to obtain a reducing atmosphere. Carbon has high deoxidizing ability, and is able to enable a proper reducing atmosphere.

A pressure of the reducing gas being the firing atmosphere is normally 0.1 MPa (about 1 atm) to 1.0 MPa (about 10 atm), preferably 0.1 MPa to 0.5 MPa. When the pressure of the firing atmosphere is less than 0.1 MPa, there is a possibility that emission intensity of the phosphor powder becomes weak because the composition of the phosphor powder obtained after the firing is likely to be different from that of a desired phosphor compared to the phosphor material mixture which is prepared in the crucible before the firing. On the other hand, when the pressure of the firing atmosphere exceeds 1.0 MPa, firing conditions do not particularly change compared to a case when the pressure is 1.0 MPa or less, and it is not preferable from a viewpoint of energy saving.

The firing temperature is, for example, 1300° C. to 1600° C., preferably 1400° C. to 1550° C. When the firing temperature is 1300° C. to 1600° C., a high-quality single crystal phosphor powder with little defect in a crystal structure can be obtained by the firing for a short time. When the firing temperature is less than 1300° C., there is a possibility that the obtained phosphor powder falls short of reaction, and the emission intensity becomes insufficient. On the other hand, when the firing temperature exceeds 1600° C., there is a possibility that the emission intensity of the obtained phosphor powder becomes weak due to abnormal growth of the phosphor particles.

The firing time is, for example, 0.5 hours to 10 hours, preferably 1 hour to 8 hours, and more preferably 2 hours to 5 hours. When the firing time is less than 0.5 hours, or exceeds 10 hours, there is the possibility that the emission intensity of the obtained phosphor powder becomes weak due to the unreaction or the abnormal growth of the phosphor powder. The firing time is preferably a short time within a range of 0.5 hours to 10 hours when the firing temperature is high, and is preferably a long time within a range of 0.5 hours to 10 hours when the firing temperature is low.

[Led Lamp]

The white light-emitting LED lamp of this embodiment includes, for example, a blue light-emitting diode having an emission peak wavelength of 430 to 470 nm and the above-described phosphor. According to the white light-emitting LED lamp of this embodiment, the blue light-emitting diode having the emission peak wavelength of 430 to 470 nm and the phosphor exhibiting higher emission efficiency than a conventional one and having variable emission wavelength are combined, and thereby, the white light-emitting LED lamp exhibiting higher luminance than a conventional one can be obtained.

There may further be used a red to orange warm-color phosphor which emits light by converting light of the blue light-emitting diode into light having an emission peak wavelength of 580 nm or more. The warm-color phosphor contains at least one of a phosphor having a composition represented by, for example, $(Sr_{1-x-y},Ca_x,Eu_y)AlSiN_3$  Chemical formula 3:

(in the formula, "x" is a number satisfying 0.01<x<0.35, "y" is a number satisfying 0.002<y<0.03), and a phosphor having a composition represented by $K_2(Si_{1-z}Mn_z)F_6$  Chemical formula 4:

(in the formula, "z" is a number satisfying 0.02<z<0.5).

Table 2 is a table illustrating results of emission luminance and a color rendering property (Ra) of each of white light-emitting LED lamps (Embodiments 1B, 2B) each including the phosphor of this embodiment and the blue light-emitting diode (wavelength of 460 nm) and white light-emitting LED lamps (Conventional examples 1B, 2B) each including a conventional phosphor having an emission wavelength equivalent to the phosphor of this embodiment and the blue light-emitting diode (wavelength of 460 nm). A color temperature of light radiated from the white light-emitting LED lamp is 5000 K.

a phosphor layer 4 which is disposed on an upper surface side of the light-emitting diode 3 and contains the phosphor and a resin, and a resin frame 5 which supports a light-emitting part made up of the light-emitting diode 3 and the phosphor layer 4. An electrode part 6 disposed at an upper part of the resin frame 5 and the light-emitting diode 3 are electrically connected by a bonding wire 7.

The LED lamp has a mechanism where electric energy applied to the light-emitting diode 3 from the electrode part 6 through the bonding wire 7 is converted into blue light by the light-emitting diode 3, a part of the light is converted into light with longer wavelength by the phosphor layer 4 positioning at the upper part of the light-emitting diode 3, and white light is emitted to the outside of the LED lamp as a total of the light emitted from the light-emitting diode 3 and the light emitting from the phosphor layer 4.

Figure 2:
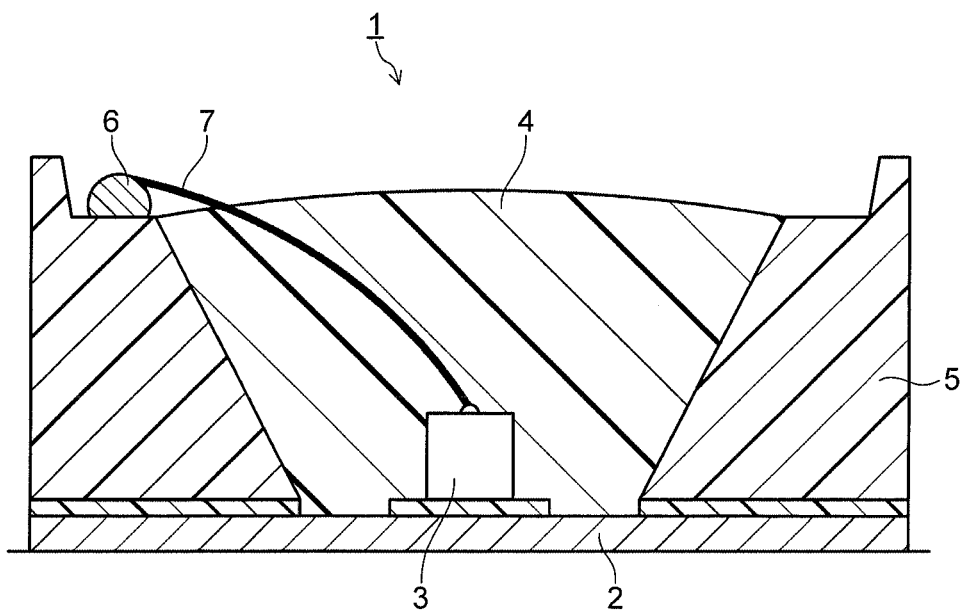
FIG. 2 is a sectional view illustrating a configuration example of an LED lamp.
Figure 3:
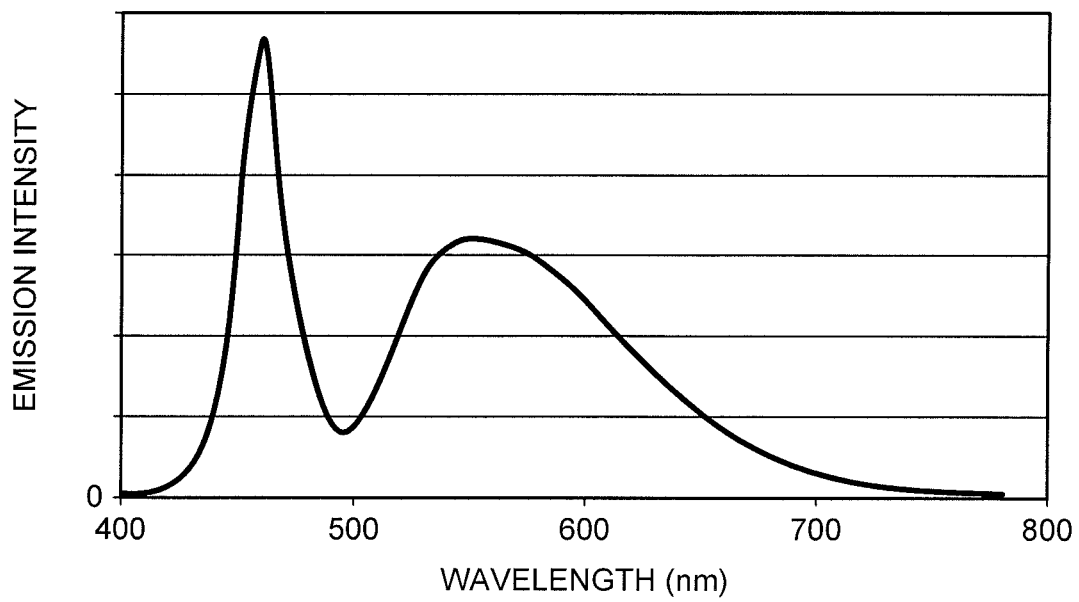
FIG. 3 is a view illustrating an example of an emission spectrum of an LED lamp.

FIG. 3 is a view illustrating an example of an emission spectrum of light radiated from the LED lamp of this embodiment. The emission spectrum illustrated in FIG. 3 is an example of the emission spectrum of the light radiated from the LED lamp using the phosphor of this embodiment and having the configuration illustrated in FIG. 2. The emission spectrum illustrated in FIG. 3 is the emission spectrum of white light where light having the emission

TABLE 2

| | Phosphor Configuration And Emission Peak Wavelength | Emission Luminance (Relative Value) | Color Rendering Property (Ra) |
|---|---|---|---|
| Embodiment 1B | $1.5(Y_{0.1}Lu_{0.9})_2O_3 \cdot 2.575(Al_{0.994}(Mg,Si)_{0.003})_2O_3$:Ce 535 nm<br>$1.5Y_2O_3 \cdot 2.6(Al_{0.996}(Mg,Si)0.002)_2O_3$:Ce 557 nm<br>$Sr_{0.90}Ca_{0.08}Eu_{0.02}AlSiN_3$ 620 nm | 115 | 85 |
| Conventional Example 1B | $1.5(Y_{0.15}Lu_{0.85})_2O_3 \cdot 2.5Al_2O_3$:Ce 535 nm<br>$1.5(Y_{0.58}Gd_{0.42})_2O_3 \cdot 2.5Al_2O_3$:Ce 557 nm<br>$(SrCa)AlSiN_3$:Eu 620 nm | 100 | 84 |
| Embodiment 2B | $1.5Y_2O_3 \cdot 2.6(Al_{0.9}Ga_{0.1})_2O_3$:Ce 546 nm<br>$K_2(Si_{0.97}Mn_{0.03})F_6$ 629 nm | 110 | 81 |
| Conventional Example 2B | $1.5Y_2O_3 \cdot 2.5Al_2O_3$:Ce 546 nm<br>$K_2SiF_6$:Mn 629 nm | 100 | 81 |

As it is clear from Table 2, the white light-emitting LED lamp including the phosphor of this embodiment exhibits excellent emission luminance while keeping a high color rendering property compared to the white light-emitting LED lamp including the conventional phosphor.

The phosphor of this embodiment is able to obtain high emission efficiency in a wider emission wavelength range than the conventional phosphor. The LED lamp including the phosphor of this embodiment has both higher luminance and higher color rendering property than a conventional lighting device such as a fluorescent light. Accordingly, it is possible to provide a high-quality light source in a technical field of general lighting or the like where high luminance and high color rendering property of white light are required. Further, expansion of demand for the LED lamp instead of the fluorescent light is expected because energy saving performance can be improved compared to the conventional fluorescent light.

FIG. 2 is a sectional view illustrating a configuration example of an LED lamp. An LED lamp 1 illustrated in FIG. 2 is configured by including a substrate 2 which mounts lamp components, a blue light-emitting diode (light-emitting element) 3 which is mounted on the substrate 2 and emits light with the emission peak wavelength of 430 to 470 nm, peak wavelength of 460 nm radiated from the blue light-emitting diode is converted by the phosphor.

Figure 4:
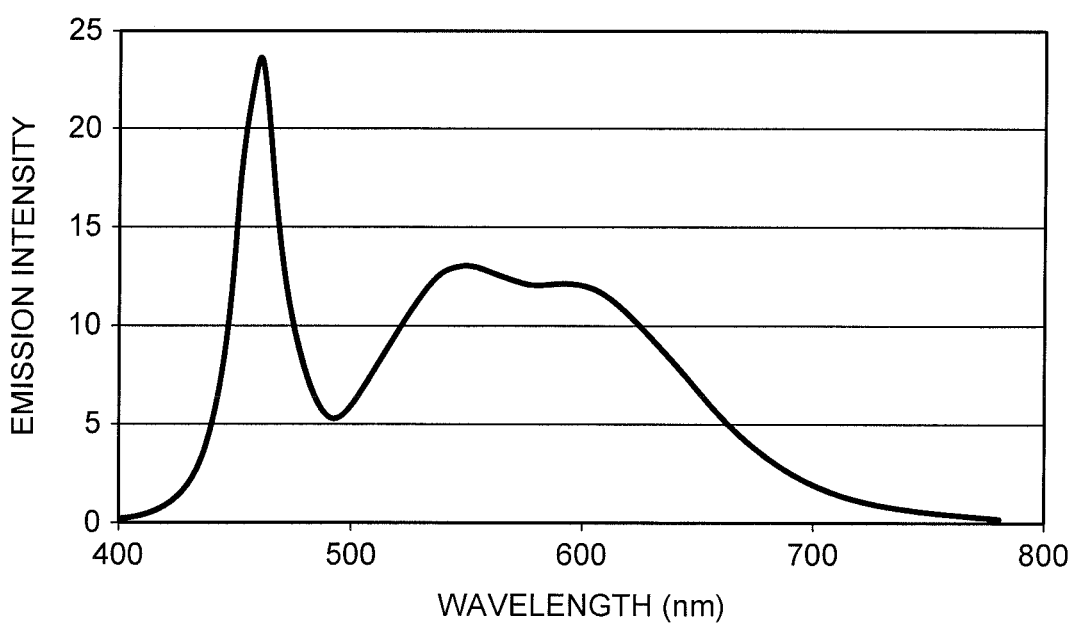
FIG. 4 is a view illustrating an example of an emission spectrum of an LED lamp.

FIG. 4 is a view illustrating an example of an emission spectrum of light radiated from the LED lamp of this embodiment. The emission spectrum illustrated in FIG. 4 is a view illustrating an example of the emission spectrum of the light radiated from the LED lamp using the phosphor of this embodiment and having the configuration illustrated in FIG. 2. The emission spectrum illustrated in FIG. 4 is an example of the emission spectrum of the LED lamp where a phosphor 1 (chemical formula: $1.5(Y_{0.1}Lu_{0.9})_2O_3 \cdot 2.575 (Al_{0.994}(Mg, Si)_{0.003})_2O_3$:Ce), a phosphor 2 (chemical formula: $1.5Y_2O_3 \cdot 2.6 (Al_{0.996}(Mg, Si)_{0.002})_2O_3$:Ce), and a phosphor 3 ($Sr_{0.09}Ca_{0.08}Eu_{0.02}AlSiN_3$) are combined. The emission spectrum in FIG. 4 is the emission spectrum of white light with the color temperature of 5000 K where light having the emission peak wavelength of 460 nm radiated from the blue light-emitting diode is converted by the phosphor.

The phosphor of this embodiment is used, and thereby, it is possible to provide a white LED lamp having higher emission efficiency than a conventional one.

EXAMPLE

There are fabricated LED lamps of respective examples where phosphors having various compositions, then each phosphor layer was formed by embedding phosphor particles with a resin as illustrated in FIG. 2, and emission characteristics thereof were evaluated.

The LED lamp of each example has the cross-sectional shape illustrated in FIG. 2. A light-emitting chip with a size of 300 μm square was disposed at a recessed bottom part of the resin frame 5 as the light-emitting diode 3, and the light-emitting chip was emitted light by applying a current value of 20 mA, and characteristics thereof were evaluated. An emission peak wavelength of light radiated from the light-emitting diode 3 was approximately 460 nm. The emission characteristics as the white LED lamp were measured by using SLIMS total luminous flux measurement system, manufactured by Labsphere Corporation.

A method of manufacturing each LED lamp is as follows. The phosphor of the embodiment and a silicone resin were mixed while changing a weight ratio to fabricate a plurality of slurries. Respective slurries were dropped on upper surface sides of different light-emitting diodes. They were heat-treated at 100 to 150° C. to cure the silicone resin to fabricate the LED lamp of each example. Next, luminances (lm) of these white LED lamps were measured.

Example 1A, Comparative Example 1A

Predetermined amounts of Yttrium oxide ($Y_2O_3$), aluminum oxide ($Al_2O_3$), magnesium oxide (MgO), silicon oxide ($SiO_2$), and cerium oxide ($CeO_2$) were weighted to be a phosphor composition illustrated in Example 1A in Table 3, mixed in a ball mill for one hour, and then fired under a reducing atmosphere. The baked phosphor was ground in a mortar, passed through a mesh to thereby obtain a cerium-activated yttrium magnesium silicon aluminate (chemical formula: $1.5Y_2O_3 \cdot 2.6(Al_{0.996}(Mg, Si)_{0.002})_2O_3:Ce$). Phosphors of Examples 2A to 10A were also fabricated by the similar method as Example 1A except that component ratios were appropriately changed to be the phosphor compositions illustrated in Table 3. A phosphor (chemical formula: $1.5(Y_{0.58}Gd_{0.42})_2O_3 \cdot 2.5Al_2O_3:Ce$) as a phosphor of Comparative example 1A having the emission wavelength equivalent to Example 1A was compared. The composition of this phosphor can also be noted as $(Y_{0.58}Gd_{0.42})_3Al_5O_{12}:Ce$. They were mixed with the silicone resin at various concentrations (mass %). After these slurries were coated on the light-emitting diodes, heat-treatment was performed at 150° C. to cure the resin to thereby fabricate white light-emitting LED lamps of Example 1 A and Comparative example 1A.

Example 2A

A cerium-activated yttrium aluminate (chemical formula: $1.5Y_2O_3 \cdot 2.625Al_2O_3:Ce$) as the phosphor was mixed with the silicone resin at various concentrations (mass %). After these slurries were coated on the light-emitting diodes, heat-treatment was performed at 150° C. to cure the resin to thereby fabricate a white light-emitting LED lamp of Example 2A.

Example 3A

A cerium-activated yttrium lutetium aluminate (chemical formula: $1.5(Y_{0.3}Lu_{0.7})_2O_3 \cdot 2.625Al_2O_3:Ce$) as the phosphor was mixed with the silicone resin at various concentrations (mass %). After these slurries were coated on the light-emitting diodes, heat-treatment was performed at 150° C. to cure the resin to thereby fabricate a white light-emitting LED lamp of Example 3A.

Example 4A

A cerium-activated yttrium magnesium silicon aluminate (chemical formula: $1.5Y_2O_3 \cdot 2.58(Al_{0.96}(Mg, Si)_{0.02})_2O_3:Ce$) as a yellowish orange light-emitting phosphor was mixed with the silicone resin at various concentrations (mass %). After these slurries were coated on the light-emitting diodes, heat-treatment was performed at 150° C. to cure the resin to thereby fabricate a white light-emitting LED lamp of Example 4A.

Example 5A

A cerium-activated yttrium lutetium magnesium silicon aluminate (chemical formula: $1.5(Y_{0.1}Lu_{0.9})_2O_3 \cdot 2.575(Al_{0.994}(Mg, Si)_{0.003})_2O_3:Ce$) as the phosphor was mixed with the silicone resin at various concentrations (mass %). After these slurries were coated on the light-emitting diodes, heat-treatment was performed at 150° C. to cure the resin to thereby fabricate a white light-emitting LED lamp of Example 5A.

Example 6A

A cerium-activated yttrium gallium aluminate (chemical formula: $1.5Y_2O_3 \cdot 2.62(Al_{0.9}Ga_{0.1})_2O_3:Ce$) as the phosphor was mixed with the silicone resin at various concentrations (mass %). After these slurries were coated on the light-emitting diodes, heat-treatment was performed at 150° C. to cure the resin to thereby fabricate a white light-emitting LED lamp of Example 6A.

Example 7A

A cerium-activated yttrium gadolinium aluminate (chemical formula: $1.5(Y_{0.9}Gd_{0.1})_2O_3 \cdot 2.6Al_2O_3:Ce$) as the phosphor was mixed with the silicone resin at various concentrations (mass %). After these slurries were coated on the light-emitting diodes, heat-treatment was performed at 150° C. to cure the resin to thereby fabricate a white light-emitting LED lamp of Example 7A.

Example 8A

A cerium-activated yttrium aluminate (chemical formula: $1.5Y_2O_3 \cdot 2.65Al_2O_3:Ce$) as the phosphor was mixed with the silicone resin at various concentrations (mass %). After these slurries were coated on the light-emitting diodes, heat-treatment was performed at 150° C. to cure the resin to thereby fabricate a white light-emitting LED lamp of Example 8A.

Example 9A

A cerium-activated yttrium boron scandium aluminate (chemical formula: $1.5Y_2O_3 \cdot 2.6(Al_{0.9}(B, Sc)_{0.05})_2O_3:Ce$) as the phosphor was mixed with the silicone resin at various concentrations (mass %). After these slurries were coated on the light-emitting diodes, heat-treatment was performed at 150° C. to cure the resin to thereby fabricate a white light-emitting LED lamp of Example 9A.

Example 10A

A cerium-activated yttrium aluminate (chemical formula: $1.5Y_2O_3 \cdot 2.56Al_2O_3:Ce$) as the phosphor was mixed with the silicone resin at various concentrations (mass %). After these slurries were coated on the light-emitting diodes, heat-treatment was performed at 150° C. to cure the resin to thereby fabricate a white light-emitting LED lamp of Example 10A.

Comparative Examples 2A to 10A

Comparative examples 2A to 10A are LED lamps produced by the similar manufacturing method by using the conventional phosphors having the emission wavelengths equivalent to the phosphors of Examples 2A to 10A.

A current of 20 mA was passed through the white light-emitting LED lamp according to each of the examples and comparative examples fabricated as above to light and emit light, and luminance and chromaticity of the emitted light were measured. The luminance at the chromaticity: x=0.33 was found from a relationship between the luminance and the chromaticity. Emission luminance (relative luminance when a comparison is set to 100) in the white light-emitting LED lamp of each phosphor is illustrated in Table 3.

Example 1B, Comparative Example 1B

There were used raw materials such as rear-earth oxides ($Y_2O_3$, $Lu_2O_3$, $Gd_2O_3$, $Tb_4O_7$), aluminum oxide ($Al_2O_3$), magnesium oxide (MgO), silicon oxide ($SiO_2$), scandium oxide ($Sc_2O_3$), boron oxide ($B_2O_3$), gallium oxide ($Ga_2O_3$), and cerium oxide ($CeO_2$), predetermined amounts were each weighted to be a phosphor composition illustrated in Example 1B in Table 4, the materials were mixed in a ball mill for one hour, and then fired under a atmosphere. The phosphor was ground in a mortar, passed through a mesh to thereby obtain a cerium-activated yttrium lutetium magnesium silicon aluminate (chemical formula: $1.5(Y_{0.1}Lu_{0.9})_2O_3 \cdot 2.575(Al_{0.994}(Mg,Si)_{0.003})_2O_3:Ce$). In addition, a europium-activated strontium calcium nitride aluminosilicate (chemical formula: $Sr_{0.90}Ca_{0.08}Eu_{0.02}AlSiN_3$) was compounded as a warm-color phosphor.

These phosphors were mixed with a silicone resin, and after the slurry was coated on the light-emitting diode, heat-treatment was performed at 150° C. to cure the resin to thereby fabricate a white light-emitting LED lamp according

TABLE 3

| | Phosphor Composition | Emission Peak Wavelength (nm) | Emission Efficiency | Emission Luminance (Relative Value) |
| --- | --- | --- | --- | --- |
| Example 1A | $1.5Y_2O_3 \cdot 2.6(Al_{0.996}(Mg,Si)_{0.002})_2O_3:Ce$ | 557 | 0.89 | 113 |
| Comp. Exam. 1A | $1.5(Y_{0.58}Gd_{0.42})_2O_3 \cdot 2.5Al_2O_3:Ce$ | 557 | 0.85 | 100 |
| Example 2A | $1.5Y_2O_3 \cdot 2.625Al_2O_3:Ce$ | 552 | 0.9 | 112 |
| Comp. Exam. 2A | $1.5(Y_{0.8}Gd_{0.2})_2O_3 \cdot 2.5Al_2O_3:Ce$ | 552 | 0.86 | 100 |
| Example 3A | $1.5(Y_{0.3}Lu_{0.7})_2O_3 \cdot 2.625Al_2O_3:Ce$ | 538 | 0.86 | 109 |
| Comp. Exam. 3A | $1.5(Y_{0.5}Lu_{0.5})_2O_3 \cdot 2.5Al_2O_3:Ce$ | 538 | 0.85 | 100 |
| Example 4A | $1.5Y_2O_3 \cdot 2.58(Al_{0.96}(Mg,Si)_{0.02})_2O_3:Ce$ | 550 | 0.86 | 105 |
| Comp. Exam. 4A | $1.5(Y_{0.85}Gd_{0.15})_2O_3 \cdot 2.5Al_2O_3:Ce$ | 550 | 0.84 | 100 |
| Example 5A | $1.5(Y_{0.1}Lu_{0.9})_2O_3 \cdot 2.575(Al_{0.994}(Mg,Si)_{0.003})_2O_3:Ce$ | 535 | 0.89 | 107 |
| Comp. Exam. 5A | $1.5(Y_{0.15}Gd_{0.85})_2O_3 \cdot 2.5Al_2O_3:Ce$ | 535 | 0.85 | 100 |
| Example 6A | $1.5Y_2O_3 \cdot 2.62(Al_{0.9}Ga_{0.1})_2O_3:Ce$ | 543 | 0.88 | 106 |
| Comp. Exam. 6A | $1.5Y_2O_3 \cdot 2.5Al_2O_3:Ce$ | 543 | 0.86 | 100 |
| Example 7A | $1.5(Y_{0.9}Gd_{0.1})_2O_3 \cdot 2.6Al_2O_3:Ce$ | 554 | 0.87 | 108 |
| Comp. Exam. 7A | $1.5(Y_{0.75}Gd_{0.25})_2O_3 \cdot 2.5Al_2O_3:Ce$ | 554 | 0.84 | 100 |
| Example 8A | $1.5Y_2O_3 \cdot 2.65Al_2O_3:Ce$ | 560 | 0.91 | 112 |
| Comp. Exam. 8A | $1.5(Y_{0.5}Gd_{0.5})_2O_3 \cdot 2.5Al_2O_3:Ce$ | 560 | 0.85 | 100 |
| Example 9A | $1.5Y_2O_3 \cdot 2.6(Al_{0.9}(B,Sc)_{0.05})_2O_3:Ce$ | 533 | 0.86 | 105 |
| Comp. Exam. 9A | $1.5Y_2O_3 \cdot 2.5(Al_{0.8}Ga_{0.2})_2O_3:Ce$ | 533 | 0.84 | 100 |
| Example 10A | $1.5Y_2O_3 \cdot 2.56Al_2O_3:Ce$ | 549 | 0.87 | 105 |
| Comp. Exam. 10A | $1.5(Y_{0.9}Gd_{0.1})_2O_3 \cdot 2.5Al_2O_3:Ce$ | 549 | 0.85 | 100 |

As it is clear from Table 3, the LED lamp using the phosphor which has a compound containing much aluminum oxide with respect to rear-earth oxide used together compared to a conventional one as a base has higher emission efficiency than the conventional one. The white LED lamp using the phosphor has higher emission luminance than a conventional one.

As it is described hereinabove, according to the phosphor of each example, higher luminance than the conventional one can be obtained by combining the phosphor with a blue light-emitting diode which emits light having a predetermined emission peak wavelength. Further, a high-quality light source can be provided in a field of application such as general lighting where high luminance and a high color-rendering property of white light are required. In addition, expansion of demand can be expected as a product which is not harmful to the environment because mercury is not contained.

to Example 1B. A conventional phosphor (chemical formula: $1.5(Y_{0.15}Lu_{0.85})_2O_3 \cdot 2.5Al_2O_3:Ce$) having an equivalent emission peak wavelength of 535 nm was compounded as Comparative example 1B, a phosphor (chemical formula: $(SrCa)AlSiN_3$: Eu) having an equivalent emission peak wavelength of 620 nm was used as the warm-color phosphor, and a white light-emitting LED lamp according to Comparative example 1B was fabricated by the similar method. Weight ratios of the phosphors were adjusted such that the chromaticity of the white LED lamp had a color temperature of 5000 K, with a deviation of ±0.001.

Phosphors of Examples 2B to 10B were also fabricated by the similar method as Example 1B while appropriately changing component ratios to be the phosphor compositions illustrated in Tables 4, 5. The warm-color phosphors used simultaneously were also illustrated in Tables 4, 5. Phosphors having equivalent emission peak wavelengths as Examples 2B to 10B were selected also in Comparative examples 2B to 10B and illustrated in Tables 4, 5. Weight ratios of the phosphors were adjusted such that the chromaticity of the white LED lamp had the color temperature of 5000 K, with the deviation of ±0.001.

Example 2B

A cerium-activated yttrium lutetium gallium aluminate (chemical formula: $1.5(Y_{0.1}Lu_{0.9})_2O_3 \cdot 2.575(Al_{0.9}Ga_{0.1})_2O_3:Ce$) as the phosphor and a europium-activated strontium calcium nitride aluminosilicate (chemical formula: $Sr_{0.72}Ca_{0.27}Eu_{0.01}AlSiN_3$) as the warm-color phosphor were mixed with the silicone resin. After the slurry was coated on the light-emitting diode, heat-treatment was performed at 150° C. to cure the resin to thereby fabricate a white light-emitting LED lamp of Example 2B. Emission peak wavelengths of the used phosphors were (530 nm, 630 nm).

Example 3B

A cerium-activated yttrium boron scandium aluminate (chemical formula: $1.5Y_2O_3 \cdot 2.575(Al_{0.9}(B, Sc)_{0.05})_2O_3:Ce$) as the phosphor and a europium-activated strontium calcium nitride aluminosilicate (chemical formula: $Sr_{0.90}Ca_{0.08}Eu_{0.02}AlSiN_3$) as the warm-color phosphor were mixed with the silicone resin. After the slurry was coated on the light-emitting diode, heat-treatment was performed at 150° C. to cure the resin to thereby fabricate a white light-emitting LED lamp of Example 3B. Emission peak wavelengths of the used phosphors were (540 nm, 620 nm).

Example 4B

A cerium-activated yttrium gallium aluminate (chemical formula: $1.5Y_2O_3 \cdot 2.6(Al_{0.9}Ga_{0.1})_2O_3:Ce$) as the phosphor and a manganese-activated potassium silicofluoride (chemical formula: $K_2(Si_{0.97}Mn_{0.03})F_6$) as the warm-color phosphor were mixed with the silicone resin. After the slurry was coated on the light-emitting diode, heat-treatment was performed at 150° C. to cure the resin to thereby fabricate a white light-emitting LED lamp of Example 4B. Emission peak wavelengths of the used phosphors were (546 nm, 629 nm).

Example 5B

A cerium-activated yttrium lutetium gallium aluminate (chemical formula: $1.5(Y_{0.1}Lu_{0.9})_2O_3 \cdot 2.575(Al_{0.9}Ga_{0.1})_2O_3:Ce$) and a cerium-activated yttrium gallium aluminate (chemical formula: $1.5Y_2O_3 \cdot 2.6(Al_{0.9}Ga_{0.1})_2O_3:Ce$) as the phosphors, further a europium-activated strontium calcium nitride aluminosilicate (chemical formula: $Sr_{0.72}Ca_{0.27}Eu_{0.01}AlSiN_3$) as the warm-color phosphor were mixed with the silicone resin. After the slurry was coated on the light-emitting diode, heat-treatment was performed at 150° C. to cure the resin to thereby fabricate a white light-emitting LED lamp of Example 5B. Emission peak wavelengths of the used phosphors were (530 nm, 546 nm, 630 nm).

Example 6B

A cerium-activated yttrium lutetium magnesium silicon aluminate (chemical formula: $1.5(Y_{0.1}Lu_{0.9})_2O_3 \cdot 2.575(Al_{0.994}(Mg, Si)_{0.003})_2O_3:Ce$) and a cerium-activated yttrium magnesium silicon aluminate (chemical formula: $1.5Y_2O_3 \cdot 2.6(Al_{0.996}(Mg, Si)_{0.002})_2O_3:Ce$) as the phosphors, further a europium-activated strontium calcium nitride aluminosilicate (chemical formula: $Sr_{0.90}Ca_{0.08}Eu_{0.02}AlSiN_3$) as the warm-color phosphor were mixed with the silicone resin. After the slurry was coated on the light-emitting diode, heat-treatment was performed at 150° C. to cure the resin to thereby fabricate a white light-emitting LED lamp of Example 6B. Emission peak wavelengths of the used phosphors were (535 nm, 557 nm, 620 nm).

Example 7B

A cerium-activated yttrium lutetium magnesium silicon aluminate (chemical formula: $1.5(Y_{0.1}Lu_{0.9})_2O_3 \cdot 2.575(Al_{0.994}(Mg, Si)_{0.003})_2O_3:Ce$) and a cerium-activated yttrium aluminate (chemical formula: $1.5Y_2O_3 \cdot 2.625Al_2O_3:Ce$) as the phosphors, further a europium-activated strontium calcium nitride aluminosilicate (chemical formula: $Sr_{0.72}Ca_{0.27}Eu_{0.01}AlSiN_3$) as the warm-color phosphor were mixed with the silicone resin. After the slurry was coated on the light-emitting diode, heat-treatment was performed at 150° C. to cure the resin to thereby fabricate a white light-emitting LED lamp of Example 7B. Emission peak wavelengths of the used phosphors were (535 nm, 552 nm, 630 nm).

Example 8B

A cerium-activated yttrium lutetium magnesium silicon aluminate (chemical formula: $1.5(Y_{0.1}Lu_{0.9})_2O_3 \cdot 2.575(Al_{0.994}(Mg, Si)_{0.003})_2O_3:Ce$) and a cerium-activated yttrium aluminate (chemical formula: $1.5Y_2O_3 \cdot 2.65Al_2O_3:Ce$) as the phosphors, further a europium-activated strontium calcium nitride aluminosilicate (chemical formula: $Sr_{0.90}Ca_{0.08}Eu_{0.02}AlSiN_3$) as the warm-color phosphor were mixed with the silicone resin. After the slurry was coated on the light-emitting diode, heat-treatment was performed at 150° C. to cure the resin to thereby fabricate a white light-emitting LED lamp of Example 8B. Emission peak wavelengths of the used phosphors were (535 nm, 560 nm, 620 nm).

Example 9B

A cerium-activated yttrium lutetium magnesium silicon aluminate (chemical formula: $1.5(Y_{0.1}Lu_{0.9})_2O_3 \cdot 2.575(Al_{0.994}(Mg, Si)_{0.003})_2O_3:Ce$) and a cerium-activated yttrium magnesium silicon aluminate (chemical formula: $1.5Y_2O_3 \cdot 2.6(Al_{0.996}(Mg, Si)_{0.002})_2O_3:Ce$) as the phosphors, further a manganese-activated potassium silicofluoride (chemical formula: $K_2(Si_{0.97}Mn_{0.03})F_6$) as the warm-color phosphor were mixed with the silicone resin. After the slurry was coated on the light-emitting diode, heat-treatment was performed at 150° C. to cure the resin to thereby fabricate a white light-emitting LED lamp of Example 9B. Emission peak wavelengths of the used phosphors were (535 nm, 557 nm, 629 nm).

Example 10B

A cerium-activated yttrium lutetium magnesium silicon aluminate (chemical formula: $1.5(Y_{0.1}Lu_{0.9})_2O_3 \cdot 2.575(Al_{0.994}(Mg, Si)_{0.003})_2O_3:Ce$) and a cerium-activated yttrium aluminate (chemical formula: $1.5Y_2O_3 \cdot 2.65Al_2O_3:Ce$) as the phosphors, further a manganese-activated potassium silicofluoride (chemical formula: $K_2(Si_{0.97}Mn_{0.03})F_6$) as the warm-color phosphor were mixed with the silicone resin. After the slurry was coated on the light-emitting diode, heat-treatment was performed at 150° C. to cure the resin to thereby fabricate a white light-emitting LED lamp of Example 10B. Emission peak wavelengths of the used phosphors were (535 nm, 560 nm, 629 nm).

(Comparative Example 2B) to (Comparative Example 10B)

As illustrated in Tables 4, 5, Comparative examples 2B to 10B are LED lamps produced by using conventional phosphors having equivalent emission peak wavelengths with the phosphors of Examples 2B to 10B, by the similar manufacturing method, respectively. Commercial items having respective wavelengths were used as the warm-color phosphors used in the comparative examples.

Regarding the white light-emitting LED lamps according to the examples and the comparative examples fabricated as above, emission luminance and a color rendering property (Ra) at a color temperature of 5000 K are illustrated in Tables 4, 5.

TABLE 4

| | Phosphor Composition | Emission Peak Wavelength (nm) | Emission Luminance (Relative Value) | Color Rendering Property (Ra) |
|---|---|---|---|---|
| Example 1B | $1.5(Y_{0.1}Lu_{0.9})_2O_3 \cdot 2.575(Al_{0.994}(Mg,Si)_{0.003})_2O_3$:Ce<br>$Sr_{0.90}Ca_{0.08}Eu_{0.02}AlSiN_3$ | 535<br>620 | 109 | 93 |
| Comparative Example 1B | $1.5(Y_{0.15}Lu_{0.85})_2O_3 \cdot 2.5Al_2O_3$:Ce<br>(SrCa)AlSiN$_3$:Eu | 535<br>620 | 100 | 93 |
| Example 2B | $1.5(Y_{0.1}Lu_{0.9})_2O_3 \cdot 2.575(Al_{0.9}Ga_{0.1})_2O_3$:Ce<br>$Sr_{0.72}Ca_{0.27}Eu_{0.01}AlSiN_3$ | 530<br>630 | 110 | 92 |
| Comparative Example 2B | $1.5Y_2O_3 \cdot 2.5(Al_{0.7}Ga_{0.3})_2O_3$:Ce<br>(SrCa)AlSiN$_3$:Eu | 530<br>630 | 100 | 91 |
| Example 3B | $1.5Y_2O_3 \cdot 2.575(Al_{0.9}(B,Si)_{0.05})_2O_3$:Ce<br>$Sr_{0.90}Ca_{0.08}Eu_{0.02}AlSiN_3$ | 540<br>620 | 108 | 87 |
| Comparative Example 3B | $1.5Y_2O_3 \cdot 2.5(Al_{0.8}Ga_{0.2})_2O_3$:Ce<br>(SrCa)AlSiN$_3$:Eu | 540<br>620 | 100 | 86 |
| Example 4B | $1.5Y_2O_3 \cdot 2.6(Al_{0.9}Ga_{0.1})_2O_3$:Ce<br>$K_2(Si_{0.97}Mn_{0.03})F_6$ | 546<br>629 | 110 | 81 |
| Comparative Example 4B | $1.5Y_2O_3 \cdot 2.5Al_2O_3$:Ce<br>$K_2SiF_6$:Mn | 546<br>629 | 100 | 81 |
| Example 5B | $1.5(Y_{0.1}Lu_{0.9})_2O_3 \cdot 2.575(Al_{0.9}Ga_{0.1})_2O_3$:Ce<br>$1.5Y_2O_3 \cdot 2.6(Al_{0.9}Ga_{0.1})O_3$:Ce<br>$Sr_{0.72}Al_{0.27}Eu_{0.01}AlSiN_3$ | 530<br>546<br>630 | 110 | 84 |
| Comparative Example 5B | $1.5Y_2O_3 \cdot 2.5(Al_{0.7}Ga_{0.3})_2O_3$:Ce<br>$1.5Y_2O_3 \cdot 2.5Al_2O_3$:Ce<br>(SrCa)AlSiN$_3$:Eu | 530<br>546<br>630 | 100 | 84 |

TABLE 5

| | Phosphor Composition | Emission Peak Wavelength (nm) | Emission Luminance (Relative Value) | Color Rendering Property (Ra) |
|---|---|---|---|---|
| Example 6B | $1.5(Y_{0.1}Lu_{0.9})_2O_3 \cdot 2.575(Al_{0.994}(Mg,Si)_{0.003})_2O_3$:Ce<br>$1.5Y_2O_3 \cdot 2.6(Al_{0.996}(Mg,Si)_{0.002})_2O_3$:Ce<br>$Sr_{0.90}Ca_{0.08}Eu_{0.02}AlSiN_3$ | 535<br>557<br>620 | 115 | 85 |
| Comparative Example 6B | $1.5(Y_{0.15}Lu_{0.85})_2O_3 \cdot 2.5Al_2O_3$:Ce<br>$1.5(Y_{0.58}Gd_{0.42})_2O_3 \cdot 2.5Al_2O_3$:Ce<br>(SrCa)AlSiN$_3$:Eu | 535<br>557<br>620 | 100 | 84 |
| Example 7B | $1.5(Y_{0.1}Lu_{0.9})_2O_3 \cdot 2.575(Al_{0.994}(Mg,Si)_{0.003})_2O_3$:Ce<br>$1.5Y_2O_3 \cdot 2.625Al_2O_3$:Ce<br>$Sr_{0.72}Ca_{0.27}Eu_{0.01}AlSiN_3$ | 535<br>552<br>630 | 111 | 92 |
| Comparative Example 7B | $1.5(Y_{0.15}Lu_{0.85})_2O_3 \cdot 2.5Al_2O_3$:Ce<br>$1.5(Y_{0.8}Gd_{0.2})_2O_3 \cdot 2.5Al_2O_3$:Ce<br>(SrCa)AlSiN$_3$:Eu | 535<br>552<br>630 | 100 | 92 |
| Example 8B | $1.5(Y_{0.1}Lu_{0.9})_2O_3 \cdot 2.575(Al_{0.994}(Mg,Si)_{0.003})_2O_3$:Ce<br>$1.5Y_2O_3 \cdot 2.65Al_2O_3$:Ce<br>$Sr_{0.90}Ca_{0.08}Eu_{0.02}AlSiN_3$ | 535<br>560<br>620 | 110 | 84 |
| Comparative Example 8B | $1.5(Y_{0.15}Lu_{0.85})_2O_3 \cdot 2.5Al_2O_3$:Ce<br>$1.5(Y_{0.5}Gd_{0.5})_2O_3 \cdot 2.5Al_2O_3$:Ce<br>(SrCa)AlSiN$_3$:Eu | 535<br>560<br>620 | 100 | 85 |
| Example 9B | $1.5(Y_{0.1}Lu_{0.9})_2O_3 \cdot 2.575(Al_{0.994}(Mg,Si)_{0.003})_2O_3$:Ce<br>$1.5Y_2O_3 \cdot 2.6(Al_{0.996}(Mg,Si)_{0.002})_2O_3$:Ce<br>$K_2(Si_{0.97}Mn_{0.03})F_6$ | 535<br>557<br>629 | 110 | 95 |
| Comparative Example 9B | $1.5(Y_{0.15}Lu_{0.85})_2O_3 \cdot 2.5Al_2O_3$:Ce<br>$1.5(Y_{0.58}Gd_{0.42})_2O_3 \cdot 2.5Al_2O_3$:Ce<br>$K_2SiF_6$:Mn | 535<br>557<br>629 | 100 | 94 |

TABLE 5-continued

|  | Phosphor Composition | Emission Peak Wavelength (nm) | Emission Luminance (Relative Value) | Color Rendering Property (Ra) |
|---|---|---|---|---|
| Example 10B | $1.5(Y_{0.1}Lu_{0.9})_2O_3 \cdot 2.575(Al_{0.994}(Mg,Si)_{0.003})_2O_3$:Ce | 535 | 109 | 93 |
|  | $1.5Y_2O_3 \cdot 2.65Al_2O_3$:Ce | 560 |  |  |
|  | $K_2(Si_{0.97}Mn_{0.03})F_6$ | 629 |  |  |
| Comparative Example 10B | $1.5(Y_{0.15}Lu_{0.85})_2O_3 \cdot 2.5Al_2O_3$:Ce | 535 | 100 | 93 |
|  | $1.5(Y_{0.5}Gd_{0.5})_2O_3 \cdot 2.5Al_2O_3$:Ce | 560 |  |  |
|  | $K_2SiF_6$:Mn | 629 |  |  |

As it is clear from results illustrated in Tables 4, 5, the white light-emitting LED lamp using the phosphor containing aluminum oxide whose ratio with respect to rear-earth oxide is higher than that of the conventional one is able to obtain the emission luminance higher than the conventional one while keeping the color rendering property of 80 or more which is practically required.

As it is described hereinabove, according to the white light-emitting LED lamp of each example, the higher luminance and the higher color rendering property than the conventional one can be obtained. In addition, a high-quality light source can be provided in a field of application such as general lighting where high luminance and a high color rendering property of white light are required. Further, expansion of demand can be expected as a product which is not harmful to the environment because mercury is not contained.

What is claimed is:

1. A phosphor comprising:
    a phosphor powder having a composition represented by a chemical formula of $1.5((Y, Lu)_{1-x}M1_x)_2O_3 \cdot 2.5a(Al_{1-y-z}Ga_y(M2, M3)_z)_2O_3$: Ce,
    wherein (Y, Lu) is at least one element selected from the group consisting of Y and Lu, M1 is Gd, (M2, M3) is (Mg, Si) or (Sc, B), (Mg, Si) is Mg and Si, (Sc, B) is Sc and B, x is a number satisfying a relationship of $0 \leq x < 0.6$, a is a number satisfying a relationship of $1.02 < a < 1.1$, y is a number satisfying a relationship of $0 \leq y < 0.4$, and z is a number satisfying a relationship of $0.002 < z < 0.1$,
    wherein a ratio of the element M3 in atom % with respect to the element M2 in atom % is in a range of 0.9 or more to 1.1 or less, and
    wherein particles of the phosphor powder have a Wadell sphericity of 0.8 or more.

2. The phosphor according to 1, wherein a ratio of Ce among rear-earth elements contained in the phosphor powder is in a range of 2 atom % or more to 20 atom % or less.

3. The phosphor according to 1, wherein an average particle diameter of the particles of the phosphor powder is in a range of 3 μm or more to 80 μm or less.

4. A method of manufacturing the phosphor according to claim 1, the method comprising:
    a step of adding barium fluoride in an amount of 0.05 mass % or more to 3 mass % or less and yttrium chloride in an amount of 0.01 mass % or more to 1 mass % or less to a mixture of phosphor materials containing elements of the phosphor powder composition; and
    firing the mixture after the adding step.

5. An LED lamp, comprising:
    a blue light-emitting diode that emits a light having an emission peak wavelength in a range of 430 nm or more to 470 nm or less; and
    a layer containing the phosphor according to claim 1 that converts a part of light radiated from the blue light-emitting diode and emits a first light.

6. The LED lamp according to claim 5, wherein the layer contains a plurality of the phosphors, and
    wherein each phosphor has a phosphor composition represented by the chemical formula, and
    wherein the phosphors are different from one another.

7. The LED lamp according to claim 5, wherein the layer further contains a second phosphor that converts another part of the light radiated from the blue light-emitting diode and emits a second light having an emission peak wavelength of 580 nm or more.

8. The LED lamp according to claim 7, wherein the second phosphor contains at least one of (1) a phosphor having a composition represented by a chemical formula of $(Sr_{1-x-y}, Ca_x, Eu_y)AlSiN_3$, wherein x is a number satisfying a relationship of $0.01 < x < 0.35$ and y is a number satisfying a relationship of $0.002 < y < 0.03$, and (2) a phosphor having a composition represented by a chemical formula of $K_2(Si_{1-z}, Mn_z)F_6$, wherein z is a number satisfying a relationship of $0.02 < z < 0.5$.

* * * * *